United States Patent [19]

Nogami et al.

[11] Patent Number: 5,459,342
[45] Date of Patent: Oct. 17, 1995

[54] FIELD PROGRAMMABLE GATE ARRAY WITH SPARE CIRCUIT BLOCK

[75] Inventors: Kazutaka Nogami, Palo Alto, Calif.; Takayasu Sakurai, Setagaya; Fumitoshi Hatori, Tachikawa, both of Japan

[73] Assignee: Kabushiki Kaisha Toshiba, Kanagawa, Japan

[21] Appl. No.: 146,312

[22] Filed: Nov. 2, 1993

[30] Foreign Application Priority Data

Nov. 2, 1992 [JP] Japan .................. 4-294579

[51] Int. Cl.⁶ .................. H03K 19/173; H03K 19/177; H01L 21/70; H01L 27/00
[52] U.S. Cl. .................. 257/209; 257/210; 257/665; 257/202; 326/101; 326/10
[58] Field of Search .................. 257/202, 210, 257/50, 665, 209; 326/10, 16, 101; 307/465

[56] References Cited

U.S. PATENT DOCUMENTS

| | | | |
|---|---|---|---|
| 5,166,557 | 11/1992 | Chen et al. | 307/468 |
| 5,237,219 | 8/1993 | Cliff | 307/465 |
| 5,290,734 | 3/1994 | Boardman et al. | 257/530 |
| 5,293,133 | 3/1994 | Birkner et al. | 257/530 |
| 5,313,119 | 5/1994 | Cooke et al. | 307/465.1 |
| 5,328,865 | 7/1994 | Boardman et al. | 437/60 |
| 5,349,248 | 9/1994 | Parlour et al. | 307/465 |

OTHER PUBLICATIONS

Hatori, F., et al. "Introducing Redundancy in Field Programmable Gate Arrays", IEEE 1993 custom integrated circuits conference, pp. 711–714.

Primary Examiner—Robert P. Limanek
Assistant Examiner—Alexander Oscar Williams
Attorney, Agent, or Firm—Spensley Horn Jubas & Lubitz

[57] ABSTRACT

A field programmable gate array, comprises: a plurality of circuit blocks each having logic circuits; at least one spare circuit block having logic circuits; a set of interconnections including at least one interconnection for connecting at least one of the circuit blocks and the at least one spare circuit programmably; and at least one connecting element disposed on the interconnection of the set of interconnections which turns its status from a turned-on state to a turned-off state or vice versa when programmed. When any one of the circuit blocks is defective, since the defective circuit block can be replaced with the spare circuit block, it is possible to retain any desired functions of the logic circuits by programming the connecting means, thus improving the production yield of the field programmable gate array and thereby reducing the manufacturing cost thereof.

10 Claims, 6 Drawing Sheets

FIELD PROGRAMMABLE GATE ARRAY WITH SPARE CIRCUIT BLOCK

BACKGROUND OF THE INVENTION

The present invention relates to FPGAs (field programmable gate arrays).

Figure 12:
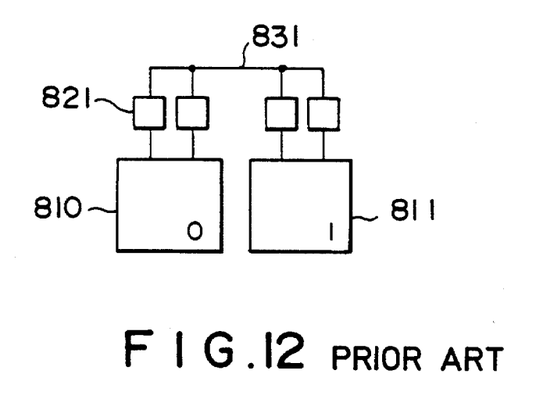
FIG. 12 is a block diagram showing the configuration of a conventional field programmable gate array.

FIG. 12 shows a general configuration of an FPGA. In the figure, the circuit blocks 810 and 811 each including logic circuits are arranged. These circuit blocks 810 and 811 are connectable to each other through interconnection 831. Further, these circuit blocks 810 and 811 are also connectable to external terminals (which are not shown in this figure) through the interconnection 831, respectively. In addition, connecting means 821 are arranged between the interconnection 831 and each of the circuit blocks 810 and 811, respectively. Each of these connecting means 821 are programmed/not programmed from a turned-on state to a turned-off state or vice versa in accordance with a program prepared by a user after the FPGA has been shipped. In other words, it is possible to obtain an apparatus providing with desired functions by connecting the interconnection 831 and the circuit blocks 810 and 811 freely in accordance with the programmed connecting means 821.

Figure 13:
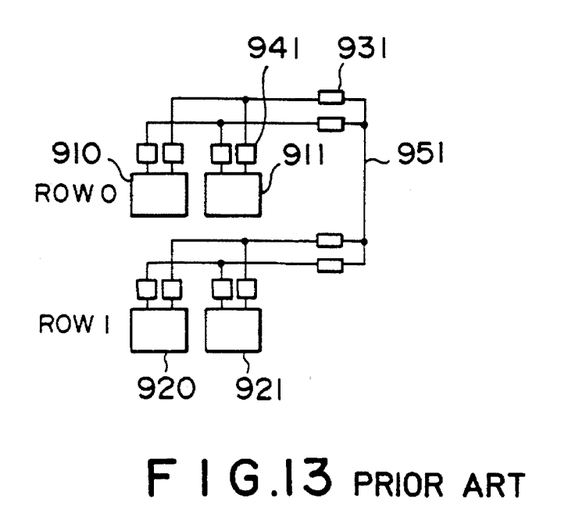
FIG. 13 is a block diagram showing the configuration of another conventional field programmable gate array.

FIG. 13 shows another FPGA in which a plurality of circuit blocks 910 and 911 is arranged in the first row ROW 1 and circuit blocks 920 and 921 in the second row ROW 2, respectively. Further, interconnection 951 is provided to programmably connect the circuit blocks 910, 911, 920 and 921 each other or to programmably connect the circuit blocks 910 to 921 with external terminals, respectively. Programmable connecting means 941 are arranged between the circuit blocks 910 to 921 and the interconnection 951, respectively and further other connecting means 931 are arranged on interconnection 951, respectively. Using the FPGA, it is possible to obtain desired functions by programming the connecting means 931 and 941, respectively.

In the above-mentioned FPGAs, however, there exists a problem as follows: since users would use any part of the prepared circuit blocks, connecting means and interconnection, all the interconnections and all the connecting means must be perfect or non-defective. In other words, if any one of a plurality of the circuit blocks will not function or only one of a plurality of interconnections is disconnected or any one of a plurality of the connecting means cannot be programmed, the desired functions could not be obtained. Recently, the capacity of FPGAs has been increasing, and it causes a low production yield and a high chip cost of FPGAs.

SUMMARY OF THE INVENTION

Consequently, it is the object of the present invention to provide a field programmable gate arrays which has a higher production yield and a lower manufacturing cost thereof.

To achieve the object, the present invention provides a field programmable gate arrays, comprising: a plurality of circuit blocks each having logic circuits; at least one spare circuit block having logic circuits; a set of interconnecting segments including at least one interconnection for programmably connecting at least one of said circuit blocks and said at least one spare circuit; and at least one connecting means arranged on the interconnections of the set of interconnecting segments which can be changed its state from turned-on to a turned-off or vice versa by programming.

In the field programmable gate array according to the present invention, when any one of the circuit blocks is defective, the defective circuit block can be replaced with the spare circuit block. And it results the high production yield of the field programmable gate arrays and the low manufacturing cost thereof.

BRIEF DESCRIPTION OF THE DRAWINGS

FIG. 6 is a block diagram for assistance in explaining the operation when the field programmable gate array shown FIG. 5 is defective partially;

DETAILED DESCRIPTION OF THE PREFERRED EMBODIMENTS

Figure 1:
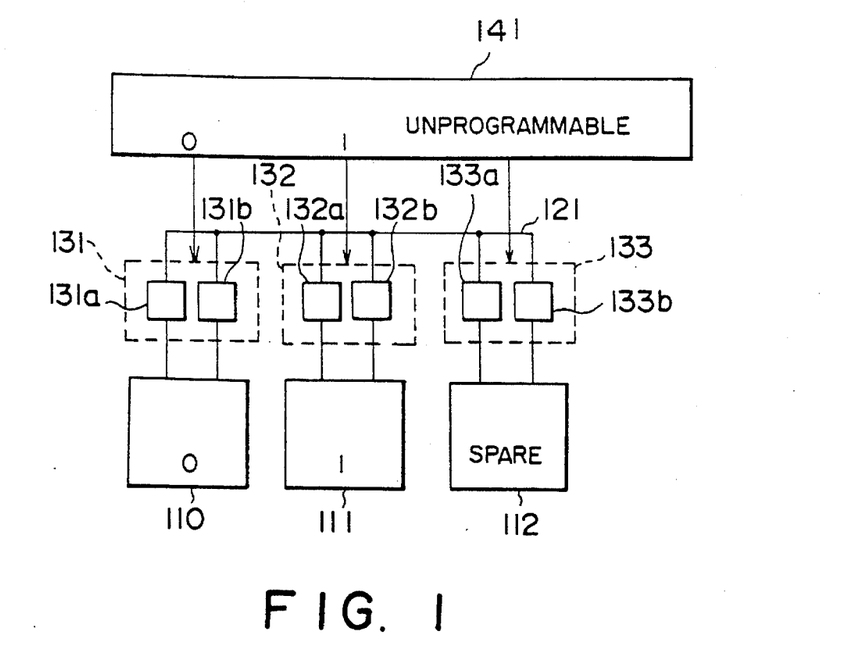
FIG. 1 is a block diagram showing the configuration of a first embodiment of the field programmable gate array according to the present invention.

The embodiments of the field programmable gate array (FPGA) according to the present invention will be described hereinbelow with reference to the attached drawings. FIG. 1 is a block diagram showing the first embodiment of the present invention. The FPGA comprises a plurality of regular circuit blocks 110 and 111, a spare circuit block 112, a plurality of sets of connecting means 131 and 132, a set of spare connecting means 133, an interconnection 121, and control means 141. In each of the regular circuit blocks 110 and 111, logic circuits are formed. The configuration of the spare circuit block 112 is electrically equivalent to that of the regular circuit blocks 110 and 111. The set of connecting means 131 consists of programmable switches 131a and 131b for connecting the regular circuit block 110 and the interconnection 121; the set of connecting means 132 consists of programmable switches 132a and 132b for connecting the circuit block 111 and the interconnection 121; and a spare set of connecting means 133 consists of spare programmable switches 133a and 133b for connecting the spare circuit block 112 and the interconnection 121, respectively. Further, the interconnection 121 can be connected to an external terminal (not shown).

The control means 141 controls the programming of each set of the connecting means 131 and 132 and the spare set of connecting means group 133. If the circuit blocks 110, 111 and the interconnection 121 are not defective, the spare set of connecting means 133 cannot be programmed by the control means 141 after shipping. In this case users can customise the FPGA by programming the sets of connecting means 131, 132. Assuming the programmable switches are antifuses, the set of connecting means 133 holds turn off state permanently. The structure of an anti-fuse will be explained later with reference to FIG. 11. As described above, under normal case, the control means 141 can control the state of only the set of connectiing means 131 and 132, but cannot control the state of spare set of connecting means 133.

Figure 2:
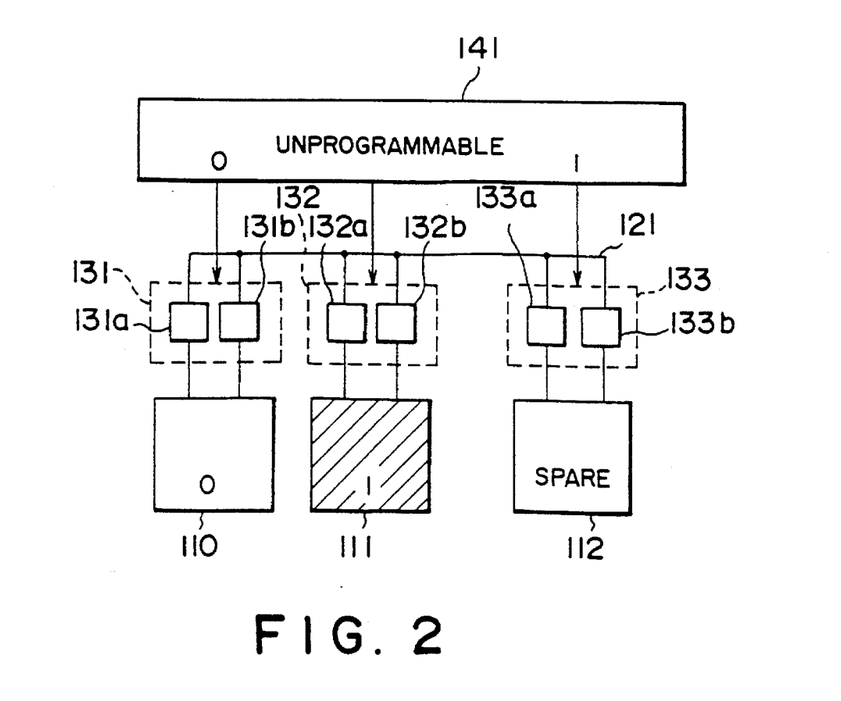
FIG. 2 is a block diagram for assistance in explaining the operation when the field programmable gate array shown in FIG. 1 is defective partially.

FIG. 2 shows a case when the block circuit 111 of the same FPGA shown in FIG. 1 is defective. In this case the spare set of connecting means 133 can be programmed by the control means 141, while the set of connecting means 132 cannot be programmed by the control means 141 after shipping. Accordingly, the regular circuit block 110 and the spare circuit block 112 can be connected through the interconnection 121, by programming the set of connecting means 131 and the spare set of connecting means 133. Here, the regular circuit blocks 110 and 111 are electrically equivalent to the spare circuit block 112, respectively and further the sets of regular connecting means 131 and 132 are also electrically equivalent to the spare set of connecting means 133, respectively. Therefore, users can customise the FPGA quite the same manner as in the case of the circuit block 111 is non-defective. As described above, in case there exists a defect in the regular circuit blocks 110 or 111 or the interconnection 121 between the regular circuit blocks 110 and 111, it is possible to recover the entire FPGA from the defect by replacing the defective circuit block by the spare circuit block 112. It results in improving the production yield thereof and reducing the manufacturing cost thereof.

Figure 3:
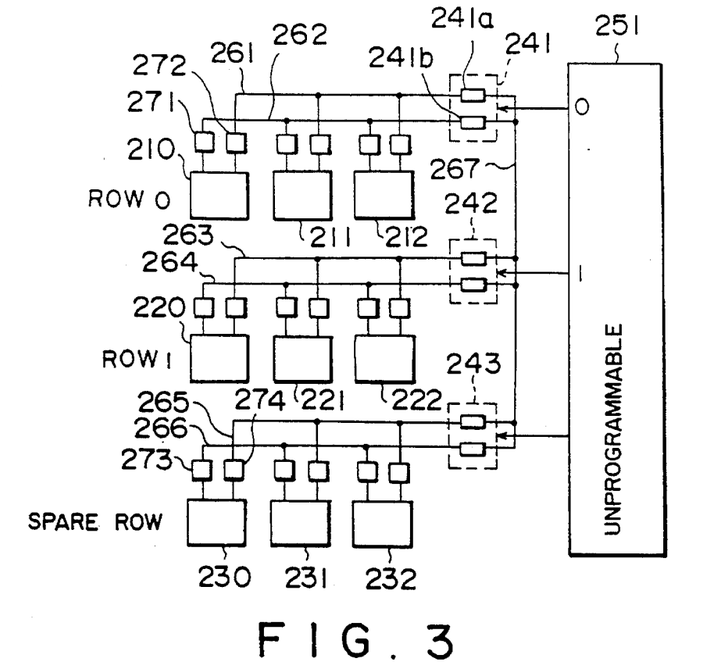
FIG. 3 is a block diagram showing the configuration of a second embodiment of the field programmable gate array according to the present invention.

FIG. 3 shows the second embodiment of the FPGA according to the present invention. In the first embodiment shown in FIG. 1, a plurality of the regular circuit blocks 110 and 111 are arranged for one row, and further the interconnection 121 is provided to connect the regular circuit blocks 110 and 111 and the spare circuit block 112, respectively. In comparison with the first embodiment, in this second embodiment, the regular circuit blocks 210 to 222 are arranged in a matrix pattern of two-columns and three-rows. In addition, a plurality of the spare circuit blocks 230 to 232 are arranged in the spare row (one for each column, respectively).

The regular circuit block 210 can be connected to two interconnections 261 and 262 using two connecting means 271 and 272, respectively. The other remaining regular circuit blocks 211, 212, 220, 221, 222, 230, 231 and 232 can be connected to interconnections 261, 262, 263, 264, 265 and 266 using connecting means 273 to 274 in the same way as above. The interconnections 261 and 262 provided for the regular row 0 can be connected to the interconnection 267 (for connecting the regular circuit blocks 210 to 222) via sets of connecting means 241 which consists of programmable switches 241a and 241b. In the same way as above, the interconnections 263 and 264 provided for the regular row 1 can be connected to the interconnection 267 (for connecting the regular circuit blocks 210 to 222) using set of connecting means.

The spare row is configured similarly to the regular rows 0 and 1. In more detail, the spare circuit blocks 230 to 232 and the interconnections 265 and 266 can be connected by spare connecting means 273 and 274. Further, the interconnections 265 and 266 and the interconnection 267 can be connected using a set of connecting means 243.

The control means 251 controls the programming of sets of the connecting means 241 and 242 in the regular rows 0 and 1 and the spare set of connecting means 243 in the spare row. If the circuit blocks 210, 211, 212, 220, 221 and 222, and interconnections 261, 262, 263 and 264 are not defective, the spare set of connecting means 243 cannot be programmed by the control means 251 after shipping. In this case users can customise the FPGA by programming the sets of connecting means 241 and 242.

Figure 4:
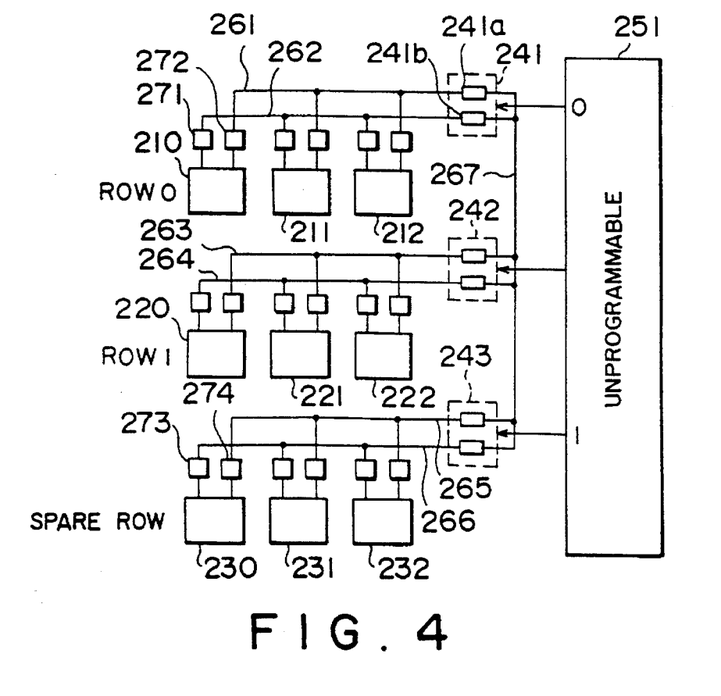
FIG. 4 is a block diagram for assistance in explaining he operation when the field programmable gate array shown in FIG. 3 is defective partially.

FIG. 4 shows a case when the interconnection 263 in the regular row 1 is defective. In this case the spare set of connecting means 243 can be programmed by the control means 251, while the set of connecting means 242 cannot be programmed by the control means 251 after shipping. As described above, in any case where any one of the regular circuit blocks, the interconnections and the set of connecting means arranged in the regular rows is defective, the defective row can be replaced by the spare row. And it improves the production yield of the FPGA and reduces the cost of the FPGA thereof.

Figure 5:
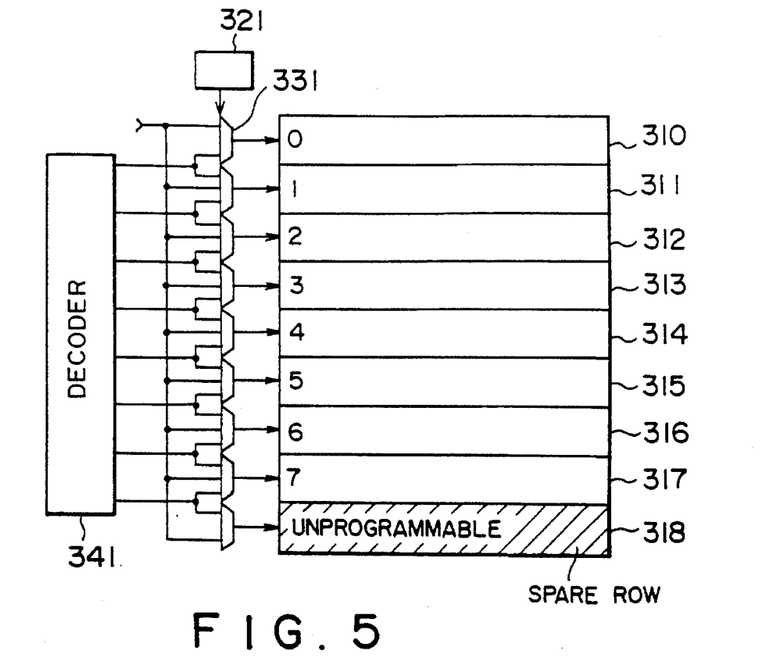
FIG. 5 is a block diagram showing the configuration of a third embodiment of the field programmable gate array according to the present invention.

FIG. 5 shows the configuration of the third embodiment of the present invention, in which regular circuit blocks 310 to 317 in each of which logic circuits are formed are arranged in the regular rows from 0 to 7, respectively. Further, a spare circuit block 318 are arranged in a spare row. Each logic block including the spare row has programmable switches, which are not depicted in FIG. 5, and the switches can be programmed by the signal from the row decoder 341. To connect the each decoded signal to the appropriate row the selector 331 is used. The non-volatile storing means 321 has the position data of the defective row, which is stored by the manufacturer of the chip, and controls the selector 331 to connect the each of the decoded signals to the appropriate row.

Figure 7:
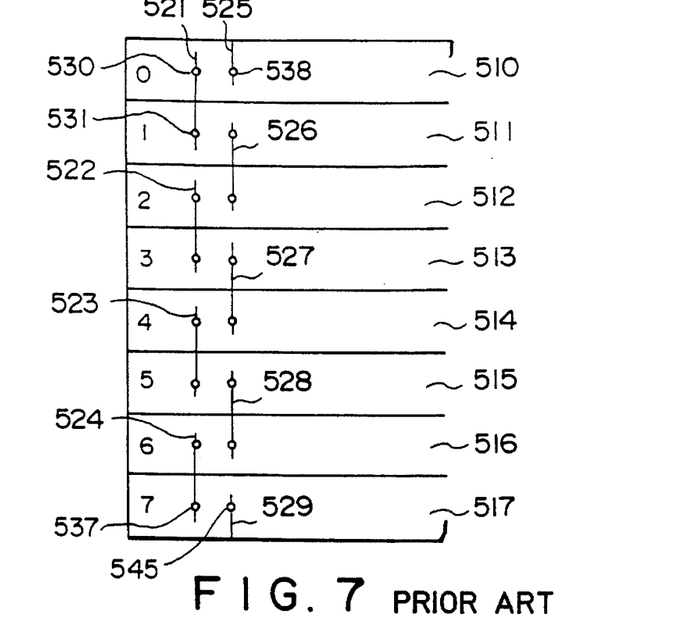
FIG. 7 is a set of interconnecting segments of a conventional field programmable gate array.

Before explaining replacement principle of a defective row with the spare row, the modification interconnections connecting a plurality of rows will be explained. FIG. 7 shows an FPGA without the redundancy scheme. In this figure the circuit blocks 510 to 517 are arranged in rows. The interconnections 521 to 529 represents interconnecting segments which can connect a plurality of rows by programming the programmable switch 530 to 545. Although the explanation will be done for two row length interconnecting segments, the modification manner is same for the other length interconnections. The rows 0 and 1 in FIG. 7 can be connected by the interconnection 521; the rows 1 and 2 can be connected by the interconnection 526; the rows 2 and 3 can be connected by the interconnection 522, and so on. In this case, if the circuit block 513 arranged in the row 3 is defective and replaced with the row 4 for instance, since there are no interconnections for connecting the row 2 and the row 4, the connection between the circuit blocks will be restricted.

Figure 8:
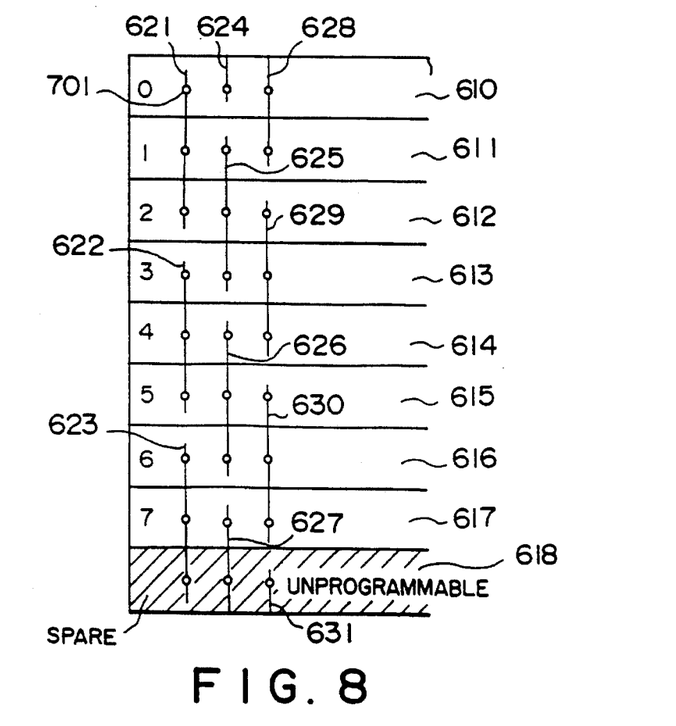
FIG. 8 is a set of interconnecting segments in the third embodiment of the field programmable gate array according to the present invention.

To eliminate this problem, in the FPGA with the redundancy scheme the length of interconnection for connecting rows must be extended by one row length. Consequently, the length of the interconnecting segments for connecting two adjacent rows in the third embodiment must be replaced with the three row length segments as shown in FIG. 8. The extended portion can be used only if there is a defective row. In other words, the interconnecting segments in FIG. 8 which has three row length are used as the two row length segments logically. For example, the interconnection 621 in FIG. 8 can connect the row 0 and the row 1 and cannot connect the row 2 if the both of the row 0 and row 1 is not defective. When the row 1 is defective, it is replaced by the row 2 and the interconnection 621 can connect the row 0 and the row 2. The usable portions of the interconnections are defined by connecting the each signal from the row decoder 341 to the appropriate row.

Next the replacement of the defective row will be explained using FIG. 5, FIG. 6 and FIG. 8. FIG. 5 corresponds to the case there is no defective row. In this case, because no signal from the row decoder 341 is connected to the spare row after shipping, users customise the FPGA without using the spare row. As is mentioned before the interconnection 621 is used to connect the row 0 and the row 1, and not used to connect the row 2; the interconnection 622 is used to connect the row 3 and the row 4, and not used to connect the row 5, and so on.

Figure 6:
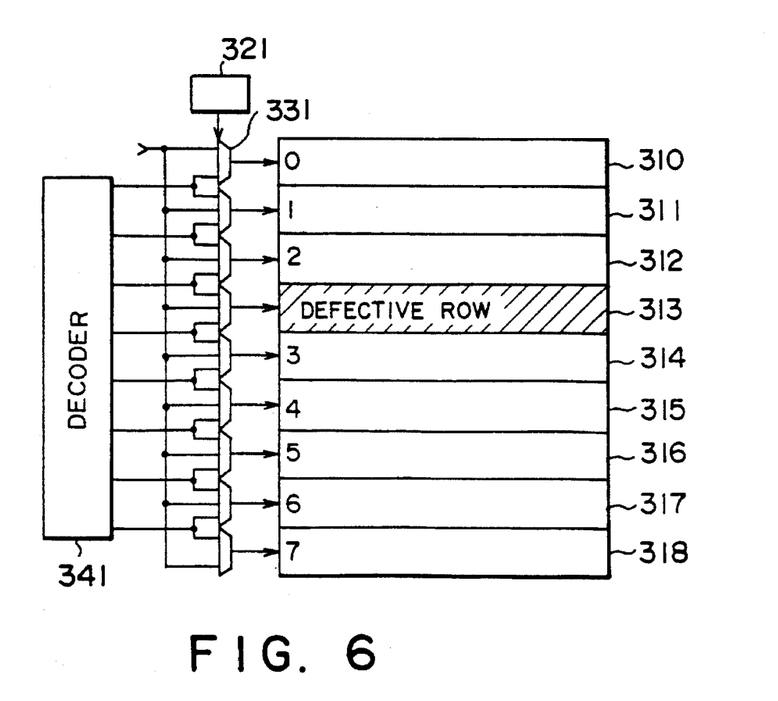

FIG. 6 shows the case the row 3 is defective. In this case, the signal for the row 3 is shifted down by one row and connected to the row 4; the signal for the row 4 is shifted down by one row and connected to the row 5; and so on. The control for the shifting is done by the control circuit 321. Because no signal from the decoder is connected to the row 3, users customise the FPGA without using the row 3. The interconnection 621 is used to connect the row 0 and the row 1, and not used to connect the row 2; the interconnection 625 is used to connect the row 1 and the row 2 and not used to connect the row 3; the interconnection 622 is used to connect the row 4 and the row 5 and not used to connect the row 3, the interconnection 626 is used to connect the row 5 and the row 6, and not used to connect the row 4; the interconnection 623 is used to connect the row 7 and the spare row, and not used to connect the row 6. Thus the modification to the interconnecting segments, which span the plurality of the rows, offers the equivalent interconnecting resources to the user even after the defective row is replaced, and it results in eliminating a change in customising the FPGA.

Figure 9:
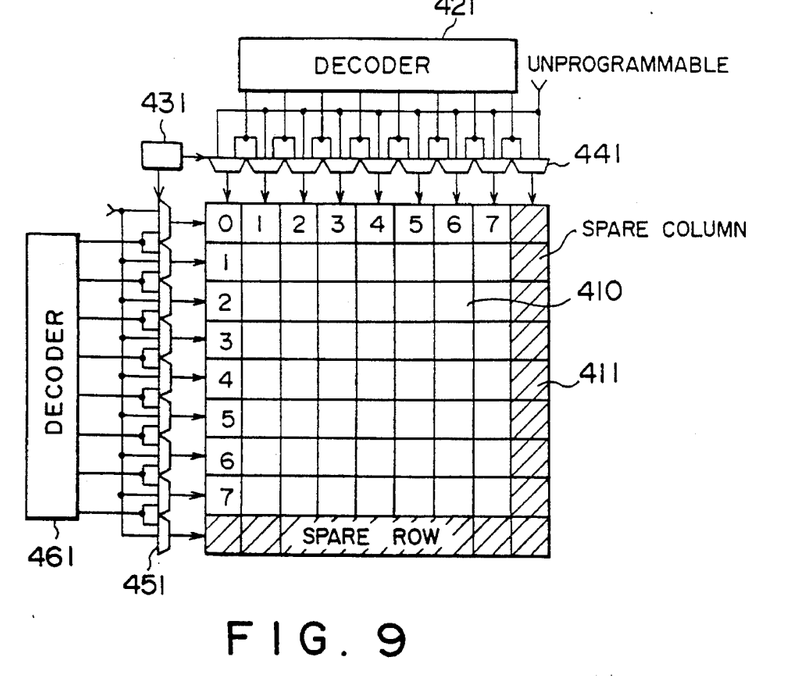
FIG. 9 is a block diagram showing the configuration of a fourth embodiment of the field programmable gate array according to the present invention.

FIG. 9 shows the fourth embodiment of the FPGA according to the present invention. In the third embodiment, the spare circuit blocks are arranged in only one row. In this fourth embodiment, however, the spare circuit blocks 411 are arranged in both row and column, which is hatched in FIG. 9.

Figure 10:
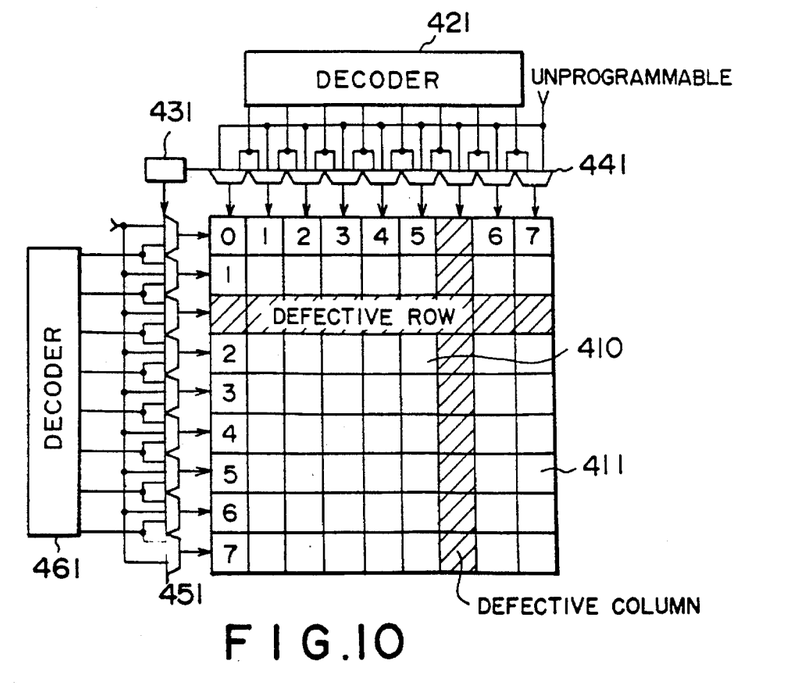
FIG. 10 is a block diagram for assistance in explaining the operation when the field programmable gate array shown in FIG. 9 is defective partially.

The fourth embodiment comprises regular circuit blocks 410 which is arranged in matrix pattern, the spare circuit blocks 411 which are arranged in a row and a column, the row programming decoder 461, the column programming decoder 421, the selectors 451 and 441, the non-volatile storing means 431 which has the position data of the defective row, which is stored by the manufacturer of the chip and controls the selectors 451 and 441. When there exist defective circuit blocks, the row which contains the defective circuit block/blocks and the column which contains the defective circuit block/blocks are replaced with another row and another column by shifting down the row and shifting left the column as shown in FIG. 10. This figure corresponds to the case the row 3 in FIG. 9 and the column 6 in FIG. 9 have the defective circuit blocks. Of course the defective row and the defective column can not be programmed by users because no signal from the row programming decoder 461 and the column programming decoder 421 as is explained in the third embodiment.

Figure 11:
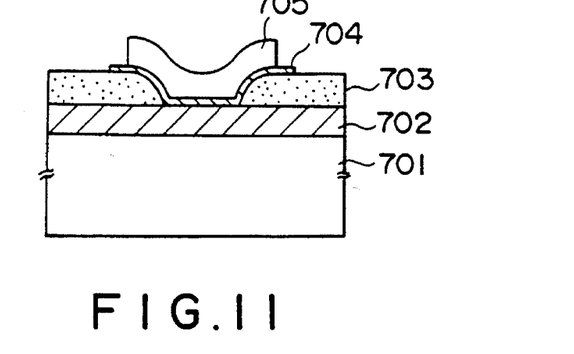
FIG. 11 is a cross-sectional view showing an antifuse structure which is available as the connecting means of the first to fourth embodiments of the present invention.

In the above-mentioned first to fourth embodiments, the programmable switches are provided for connecting the circuit blocks. As the programmable switches, any means can be used, as far as it changes its state from turn-on or turn-off by applying control bit or bits. For instance, it is possible to use an anti-fuse which is shown in FIG. 11 as the programmable switch. In the anti-fuse shown in FIG. 11, a metallic wire 702 made of aluminum or a high melting point metal is formed on a semiconductor substrate 701, and an insulating film 703 such as a silicon oxide film is formed on the surface of the metallic wire 702. Further, a connection hole is formed in this insulating film 703, and a thin insulating film 704 is formed so as to cover the formed connection hole. Further, a metallic wire 705 is formed on the insulating film 704 extending in a direction perpendicular to the paper. In this anti-fuse, the two metallic wires 702 and 705 are insulated from each other before applying the programming voltage. On the other hand, when the programming voltage is applied between the two metallic wires 702 and 705, the thin insulating film 704 is broken down, and the anti-fuse turns on. As described above, the anti-fuse type programmable switch, keeps a turned-off state before programming but changed to a turned-on state after programming. However, it is of course possible to use a fuse type programmable switch. In this case, the programmable switch keeps a turned-on state before programming, but changed to a turned-off state after programming.

What is claimed is:

1. A field programmable gate array, comprising:

a plurality of circuit blocks each having logic circuits;

at least one spare circuit block having logic circuits;

a first wire group including at least one wire disposed in the vicinity of said circuit blocks and said spare circuit block;

a second wire group including at least one wire disposed in the vicinity of said circuit blocks and said spare circuit block;

a third wire group including a plurality of wires for connecting said circuit blocks and said first wire group, respectively in parallel to each other so as to be programmable;

at least one first connecting means provided between at least one wire included in said second wire group and switched to a turned-on status or a turned-off status when programmed;

at least one second connecting means provided between at least one wire included in said third wire group and switched to a turned-on status or a turned-off status when programmed, wherein said at least one first connecting means can be switched to a turned-on status or a turned-off status when programmed under normal condition; and said at least one second connecting means is not programmable under the normal condition, but becomes programmable and can be programmed to the turned-on status or the turned-off state only if at least one of said circuit blocks, said second wire group or at least one of said first connecting means is defective.

2. The field programmable gate array according to claim 1, wherein said connecting means is an anti-fuse kept in the turned-off status before programmed but switched to the turned-on status after programmed.

3. The field programmable gate array according to claim 1, wherein said circuit block and said backup circuit block are electrically equivalent to each other in configuration; said second wire group and said third wire group are electrically equivalent to each other in configuration; and said first connecting means and said second connecting means are electrically equivalent to each other in configuration.

4. A field programmable gate array, comprising:

a set of circuit blocks having a plurality of circuit blocks arranged in a matrix, each circuit block consists of logic circuits;

a set of spare circuit blocks having a plurality of circuit blocks arranged in at least one row and/or one column, each spare circuit block consists of logic circuits;

a set of interconnections having an interconnection for connecting said circuit blocks programmably and a wire for connecting said circuit block and said spare circuit block programmably;

at least one connecting means disposed between the interconnections of said set of interconnections, which turns its status to a turned-on state or a turned-off state when programmed;

at least one spare connecting means disposed between the interconnections of said set of interconnections which turns its state to a turned-on state or a turned-off state when programmed; and control means for controlling said connecting means and said spare connecting means in such a way that when the circuit blocks, said connecting means and said set of interconnections are not defective, said connecting means is set to being programmable and said spare connecting means is set to being non-programmable; and when any one of the circuit blocks, said connecting means and said set of interconnections is defective, said connecting means corresponding to the defective position is set to being non-programmable and said spare connecting means is set to being programmable.

5. The field programmable gate array according to claim 4, wherein the circuit block and the spare circuit block are connectable to two or more other circuit blocks or backup circuit blocks, respectively.

6. The field programmable gate array according to claim 4, wherein the circuit block and the backup circuit block are electrically equivalent to each other in configuration; said wire group and said backup wire group are electrically equivalent to each other in configuration; and said connecting means and said backup connecting means are electrically equivalent to each other in configuration.

7. A field programmable gate array, comprising:

a circuit block group having at least three circuit blocks arranged in each of a plurality of rows, each circuit block being formed by logic circuits;

a spare circuit block group having at least one spare circuit block arranged in at least one row, each spare circuit block being formed by logic circuits;

a wire group including first wires for programmably connecting two of the three adjacent circuit blocks and second wires for programmably connecting two of three adjacent blocks of the circuit blocks including at least one of the spare circuit blocks;

at least one first connecting means disposed between the first wires of said wire group to programmably connect said circuit blocks, wherein said first connecting means can be switched to a turned-on status or a turned-off status when programmed under normal condition; and at least one second connecting means disposed between the second wires of said wire group to programmably connect two of three adjacent blocks including at least one spare circuit block, wherein said second connecting means can be switched to a turned-on status or a turned-off status when programmed only if at least one of said circuit blocks and the second wires is defective.

8. A field programmable gate array, comprising:

circuit blocks arranged in rows (assuming that it spans n rows, where n is an integer), at least one spare circuit block arranged in a row;

a set of interconnecting segments which can be used to connect said circuit blocks, including at least one interconnecting segment spanning a plurality of said rows; and a means for programmably connecting said interconnecting segment and said logic blocks under normal condition, and for programmably connecting said interconnecting segments, said logic blocks and said spare circuit block if at least one of said circuit blocks and said interconnecting segments is defective, wherein said at least one interconnecting segment spanning said rows is logically regarded as an interconnection spanning (n−1) rows when users customize the field programmable gate array.

9. A field programmable gate array, comprising:

an array of circuit blocks programmable to perform a logic function, said circuit blocks arranged in n rows within said array;

a set of interconnections for programmably interconnecting said array of circuit blocks; and a decoder configured to address n−1 rows of said array of circuit blocks during a programming operation, wherein when a defect is identified within an m-th one of said n rows, said decoder is configured to not address said m-th row and wherein said rows identified by indices from m+1 to n bear logical addresses from m to n−1.

10. The field programmable gate array of claim 9 wherein said array of circuit blocks comprises q columns, said field programmable gate array further comprising a second decoder configured to address q−1 columns of said array of circuit blocks during a programming operation.

* * * * *